United States Patent [19]

Ishizuka et al.

[11] Patent Number: 5,148,908
[45] Date of Patent: Sep. 22, 1992

[54] APPARATUS FOR CONVEYING LEAD FRAME

[75] Inventors: Masahiro Ishizuka; Kazuyuki Hayashi, both of Fukuoka, Japan

[73] Assignees: Mitsubishi Denki Kabushiki Kaisha, Japan;

[21] Appl. No.: 760,390

[22] Filed: Sep. 16, 1991

[30] Foreign Application Priority Data

Sep. 19, 1990 [JP] Japan ............... 2-247232

[51] Int. Cl.⁵ .............................. B65G 25/00
[52] U.S. Cl. ................ 198/774.3; 198/468.6; 414/750
[58] Field of Search ............... 198/468.6, 774.1, 774.3; 414/750

[56] References Cited

U.S. PATENT DOCUMENTS

| | | | |
|---|---|---|---|
| 4,211,321 | 7/1980 | Mosher | 198/774.3 |
| 4,411,586 | 10/1983 | Zitser et al. | 198/774.1 |
| 4,509,638 | 4/1985 | Kato et al. | 198/468.6 |
| 4,936,438 | 6/1990 | Wained | 198/468.6 |

FOREIGN PATENT DOCUMENTS 58-160082 9/1983 Japan.

*Primary Examiner*—Joseph E. Valenza
*Attorney, Agent, or Firm*—Leydig, Voit & Mayer

[57] ABSTRACT

A lead frame conveying apparatus comprises a driving force converting unit for transmitting to a frame receiving arm a horizontal reciprocating linear motion of an elliptic motion of a timing belt placed over two timing pulleys between the centers of the timing pulleys and converting semicircular motions at both ends of the horizontal reciprocating linear motion into vertical reciprocating linear motions by employing rolling contact for absorbing the horizontal component thereof and transmitting the vertical reciprocating linear motion to the frame receiving arm so as to put the frame receiving arm into a rectangular motion. The apparatus thus requires only one induction motor as a driving device.

6 Claims, 6 Drawing Sheets

APPARATUS FOR CONVEYING LEAD FRAME

BACKGROUND OF THE INVENTION

1. Field of the Invention

The present invention relates to a lead frame conveying apparatus for conveying a lead frame between guide rails which are extended parallel. The present invention also includes a transverse conveying mechanism used in the lead frame conveying apparatus and a method of converting an elliptic motion performed in the transverse conveying mechanism into a rectangular motion.

2. Description of the Related Art

FIG. 5 is a perspective view showing a conventional apparatus for conveying a lead frame. In the drawing, a lead frame 1 is transferred between two guide rails 2 and 3 by a frame receiving arm 4. For example, when the lead frame 1 is transferred from the guide rail 2 to the guide rail 3, the frame receiving arm 4 is moved in the order of A-B-C-D shown by arrows in the drawing. The guide rails 2 and 3 comprise two rails 2a, 2b and 3a, 3b, respectively, which are extended parallel. A linear guide bearing 11a is slidably mounted on a liner guide rail 11 on a base block 21, a bearing block 20 being fixed to the linear guide bearing 11a through a holder 5. A shaft 6 is passed through a bearing hole (not shown) in the bearing block 20 so as to connect the frame receiving arm 4 and a plate 7 and is fitted in the bearing hole so as to be axially slidable. The shaft 6 is provided at either side of the linear guide rail 11. The plate 7 has a lower end member 8 which is downwardly extended and on which a rolling bearing 9 is provided. An extension coil spring 10 interposed between the bearing block 20 and the plate 7 produces the force to upwardly move a portion comprising the frame receiving arm 4, the shafts 6, the plate 7, the member 8 and the rolling bearing 9. A guide plate 13 is attached to two linear guide bearings 12a, 12b which are vertically slidable and which are provided on the base block 21 so that the guide plate 13 contacts with the rolling bearing 9 which is upwardly moved by the coil spring 10. Extension coil springs 10a, 10b are respectively provided between the guide plate 13 and the base block 21 at both ends of the guide plate 13 so as to constantly generate the force to upwardly move the guide plate 12 (the coil spring 10a is not shown in FIG. 5). A rolling bearing 13a in rolling contact with a vertically moving cam 14 is provided at the center on the side of the guide plate 13, which is opposite to the side thereof engaged with the linear guide bearings 12a, 12b. The vertically moving cam 14 is eccentrically provided on the rotational shaft of a motor 16. A timing belt 18 placed over timing pulleys 19a, 19b is driven by a pulse motor 17. The connecting member 20a provided on the bearing block 20 holds the timing belt 8 therein so as to connect the bearing block 20 and the timing belt 18. The base block 21 is fixed to a base plate 22. FIG. 6 is a side view showing the basic operation of the frame receiving arm 4 of the conventional frame conveying apparatus in the case where the lead frame 1 is transferred from the guide rail 2 to the guide rail 3. When the lead frame 1 is conveyed to the guide rail 2 by an external apparatus (not shown), the frame receiving arm 4 positioned below the guide rail 2 is upwardly moved for scooping up the lead frame 1. The frame receiving arm 4 is transversely moved from a position above the guide rail 2 to a position above the guide rail 3 while holding the lead frame 1. The frame receiving arm 4 is downwardly moved for placing the lead frame 1 on the guide rail 3. The frame receiving arm 4 is then transversely moved from a position below the guide rail 3 to a position below the guide rail 2. The frame receiving arm 4 performs such a one-cycle motion. Each of the guide rails 2 and 3 is partially cut off to form a space which allows the frame receiving arm 4 to scoop up the lead frame 1 on the guide rail and place the lead frame on the guide rail, as shown in FIG. 5.

The operation of the conventional apparatus for conveying a lead frame is described below with reference to FIGS. 5 and 6. The frame receiving arm 4 waits for the lead frame 1 at point A. When the lead frame 1 is fed to the guide rail 2, the motor 16 is driven, and the vertically moving cam 14 eccentrically provided on the rotational shaft of the motor 16 is thus rotated. The rolling bearing 13a provided on the guide plate 13 is vertically moved while making rolling contact with the periphery of the vertically moving cam 14 by virtue of the coil springs 10, 10a, 10b in accordance with the distance between the portion of contact with the periphery of the vertically moving cam 14 and the rotational shaft. This causes the whole guide plate 13 to be vertically moved. When the motor is driven, and when the guide plate 13 is upwardly moved according to the rotation of the vertically moving cam 14, a portion comprising the rolling bearing 9, the lower end member 8 and the plate 7 is upwardly moved. The frame receiving arm 4 connected to the plate 7 by the shaft 6 is thus upwardly moved to point B so as to scoop up the lead frame 1 from the guide rail 2. The motor 16 is stopped at half rotation. A predetermined number of pulses are then applied to the pulse motor 17 from an external pulse generator (pulse motor driver) according to the distance between the guide rails 2 and 3 so that the pulse motor 17 is driven. When the timing pulleys 19a, 19b are rotated by driving the pulse motor 17, the timing belt 18 is rotated following the rotation of the pulleys 19a, 19b. The rotation of the timing belt 18 is converted into a transverse horizontal linear motion of the bearing block 20 through the connecting member 20a. The portion comprising the frame receiving arm 4, the bearing block 20, the connecting member 20a, the shaft 6, the plate 7, the lower end member 8 and the rolling bearing 9 is thus horizontally moved from point B to point C in the transverse direction. When the motor 16 for driving the vertically moving cam 14 is then half rotated, the guide plate 13 is downwardly pushed by the vertically moving cam 14, and at the same time, the rolling bearing 9 is also dowwnwardly pushed. The frame receiving arm 14 is consequently downwardly moved to point D so as to place the lead frame 1 on the guide rail 3. When the pulse motor 17 is driven to rotate in the reverse direction, the frame receiving arm 4 is returned to point A to complete one cycle.

In the conventional apparatus for conveying a lead frame configured as described above, since the frame receiving arm must be horizontally positioned with high accuracy according to the positions of the guide rails, the pulse motor is used. However, the pulse motor driver is required as an external apparatus for driving the pulse motor. The conventional apparatus thus has the problem that the need for two motors for vertical and horizontal motion increases the cost of the apparatus.

SUMMARY OF THE INVENTION

The present invention has been achieved for solving the above problem, and it is an object of the present invention to provide an apparatus for conveying a lead frame which comprises a single motor used for performing a sequence of operations (referred to as "rectangular motion" hereinafter) comprising vertical operations and horizontal operations and describing a rectangle.

It is another object of the present invention to provide a transverse conveying unit used in the lead frame conveying apparatus and a method of converting an elliptic motion into a rectangular motion.

In order to achieve the objects, the present invention provides a lead frame conveying apparatus for transferring a lead frame sent to one of two guide rails between the two guide rails by scooping up the lead frame in a space formed by partially cutting off each of the guide rails, the apparatus comprising frame receiving means for carrying the lead frame, moving block means holding said frame receiving means so that the frame receiving means vertically slides so as to be elastically balanced at a predetermined neutral position thereof in the horizontal direction along the transfer direction, horizontal linear guide means extended between the two guide rails in order to horizontally guide the moving block means along the transfer direction of the lead frame, stopper means for horizontally positioning the frame receiving means corresponding to the positions of the two guide rails, driving force transmitting means for making an elliptic motion which describes an ellipse and which comprises a horizontal reciprocating linear motion between the two guide rails and semi-circular motions at both ends of the reciprocating motion, driving means for giving a driving force to the driving force transmitting means, driving force converting means which is provided on the moving block means and which is connected to the driving force transmitting means and the frame receiving means so as to transmit the horizontal reciprocating linear motion in the elliptic motion of the driving force transmitting means to the frame receiving means and convert the semi-circular motions at both ends of the reciprocating linear motion into vertical reciprocating linear motions by employing rolling contact for absorbing the horizontal component thereof and transmit the vertical reciprocating linear motions to the frame receiving means so that the frame receiving means performs a rectangular motion.

The present invention further includes a transverse conveying mechanism used in the lead frame conveying apparatus and a method of converting an elliptic motion into a rectangular motion.

In the present invention, the elliptic motion of the driving force transmitting means driven by single driving means is converted into the rectangular motion which describes a rectangle by the driving force converting means which employs rolling contact, and transmitted to the frame receiving means.

DESCRIPTION OF PREFERRED EMBODIMENTS

Figure 1:
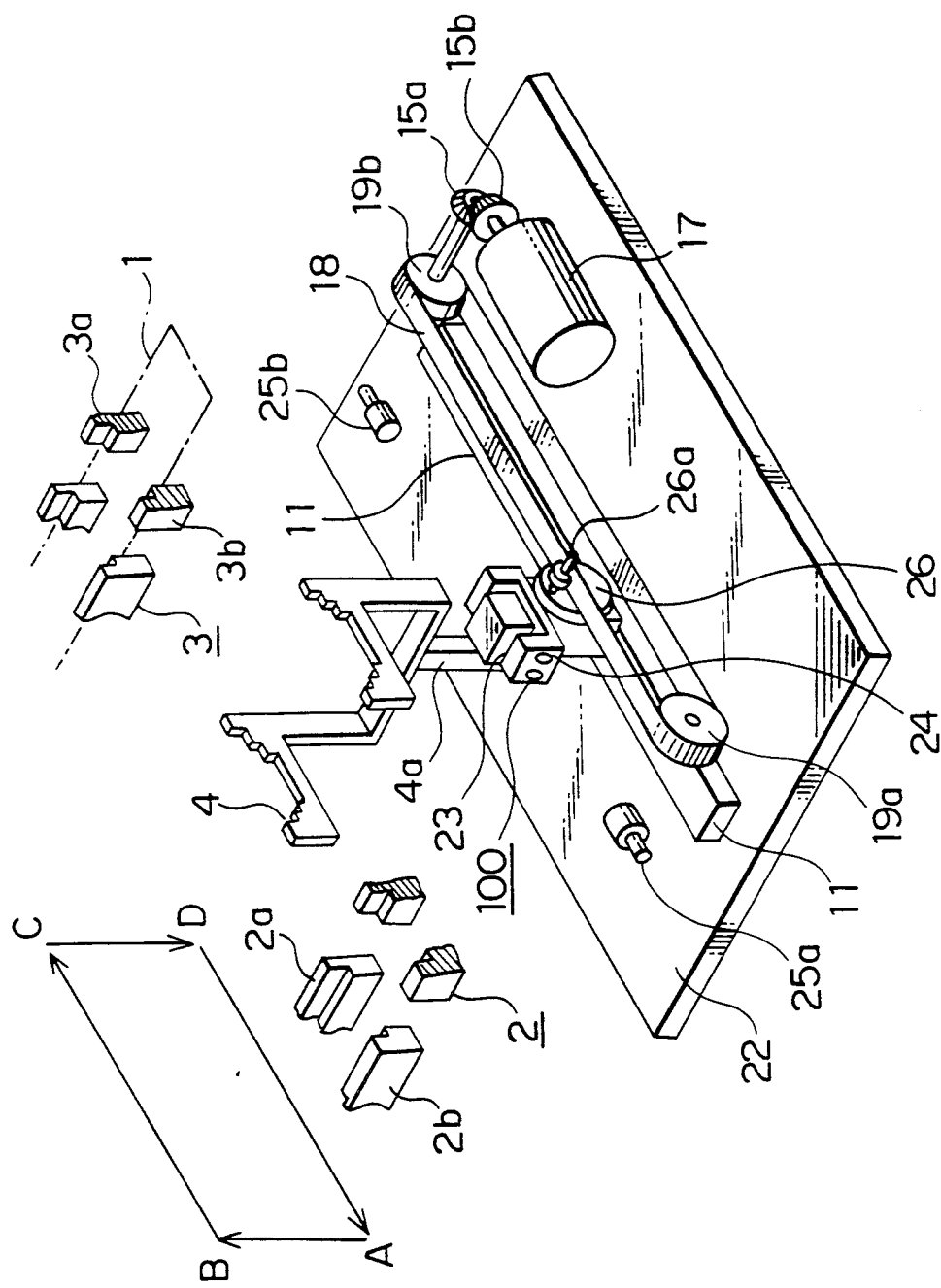
FIG. 1 is a schematic perspective view showing a lead frame conveying apparatus according to an embodiment of the present invention.
Figure 2:
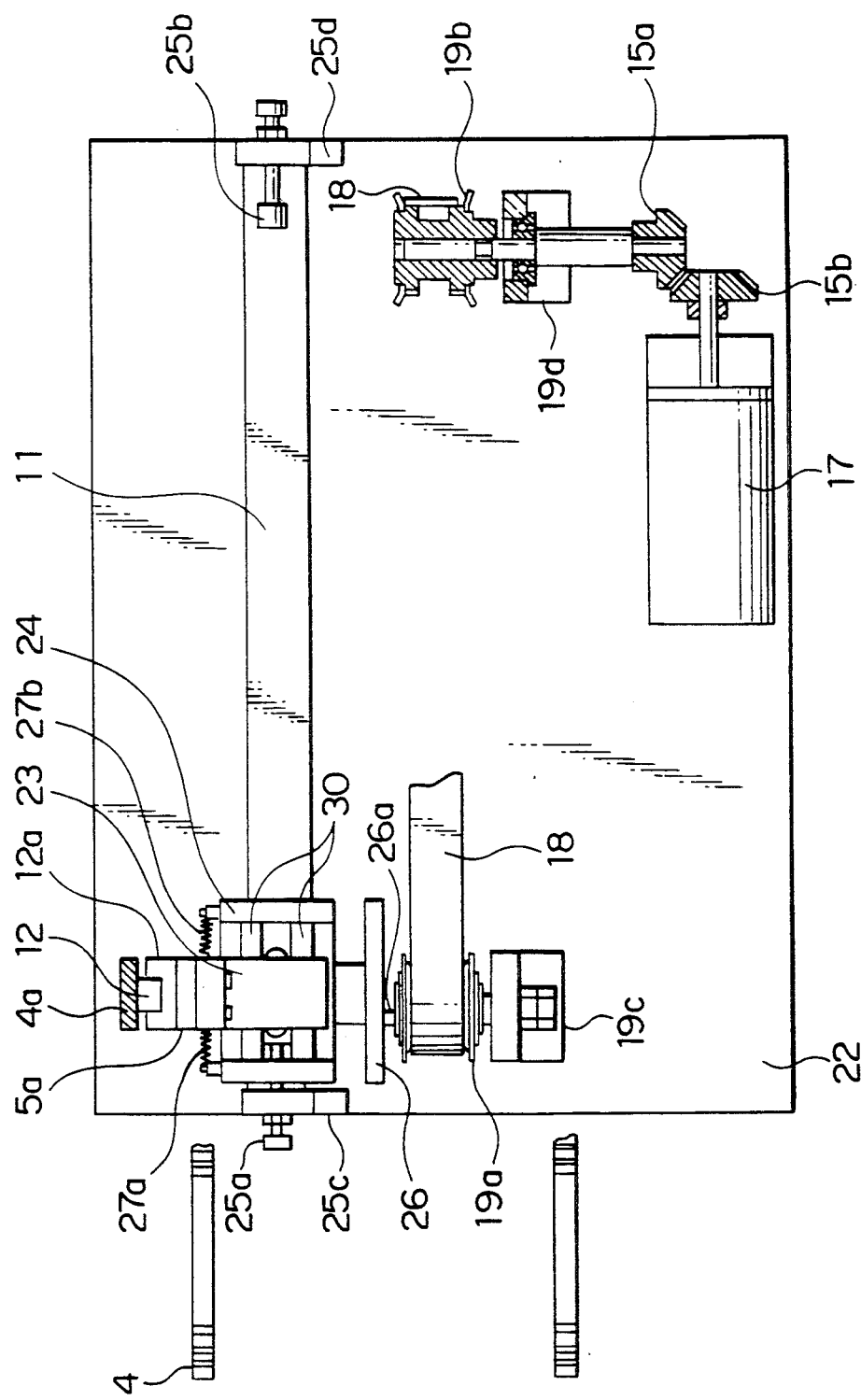
FIG. 2 is a top view of the lead frame conveying apparatus shown in FIG. 1.
Figure 3:
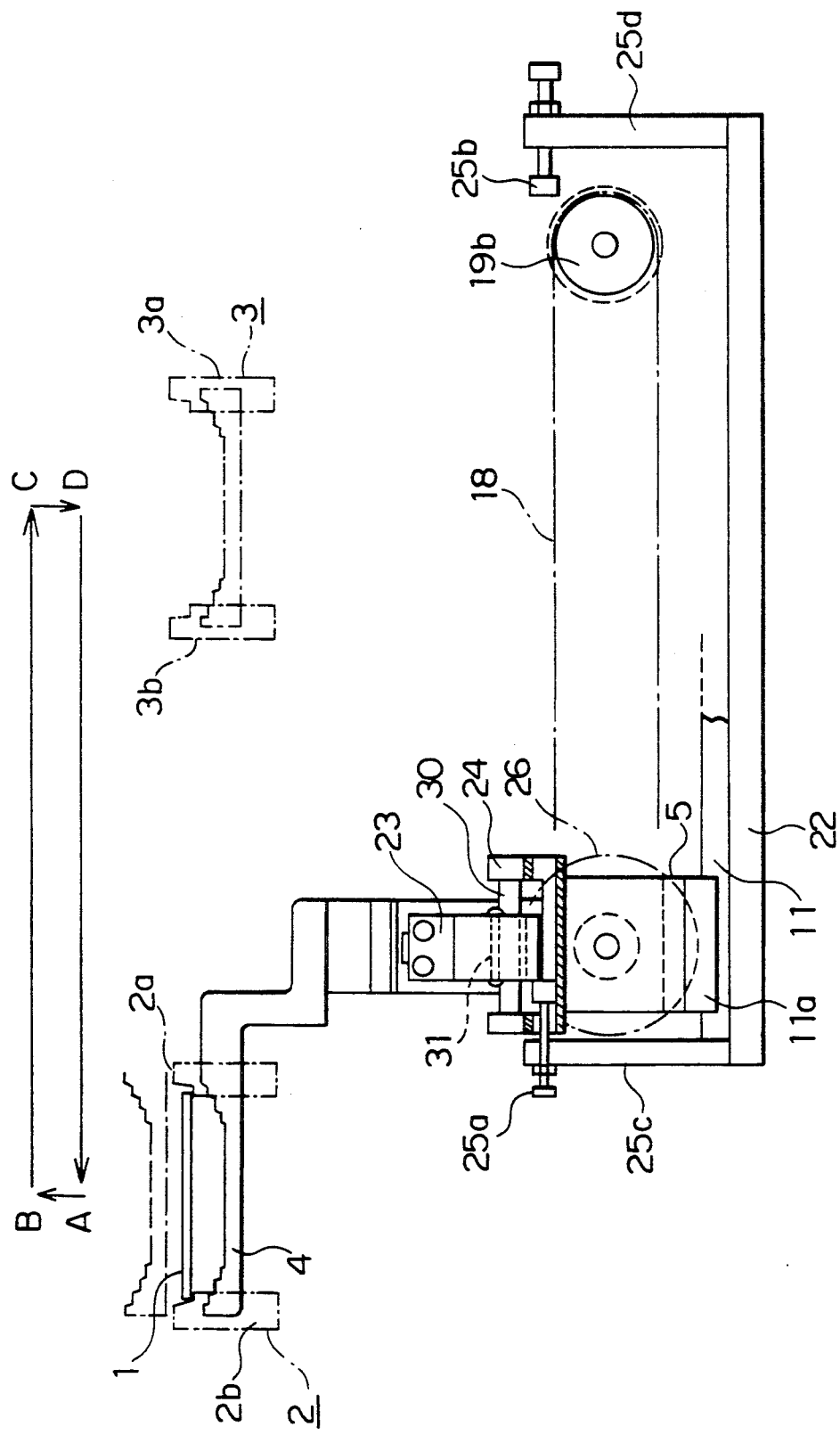
FIG. 3 is a front view of the lead frame conveying apparatus shown in FIG. 1 without showing a timing pulley portion.
Figure 4:
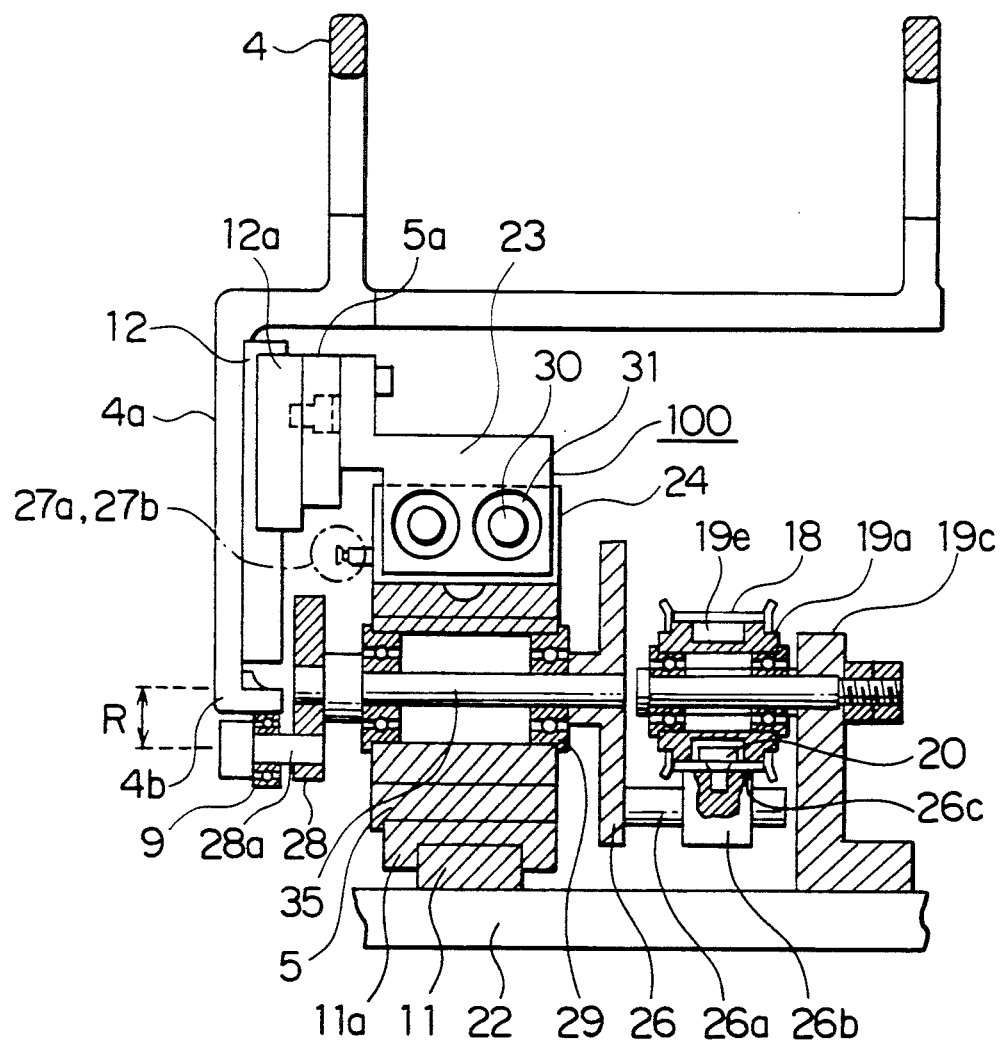
FIG. 4 is a partially sectional side view of a principal portion of the lead frame conveying apparatus shown in FIG. 1.
Figure 5:
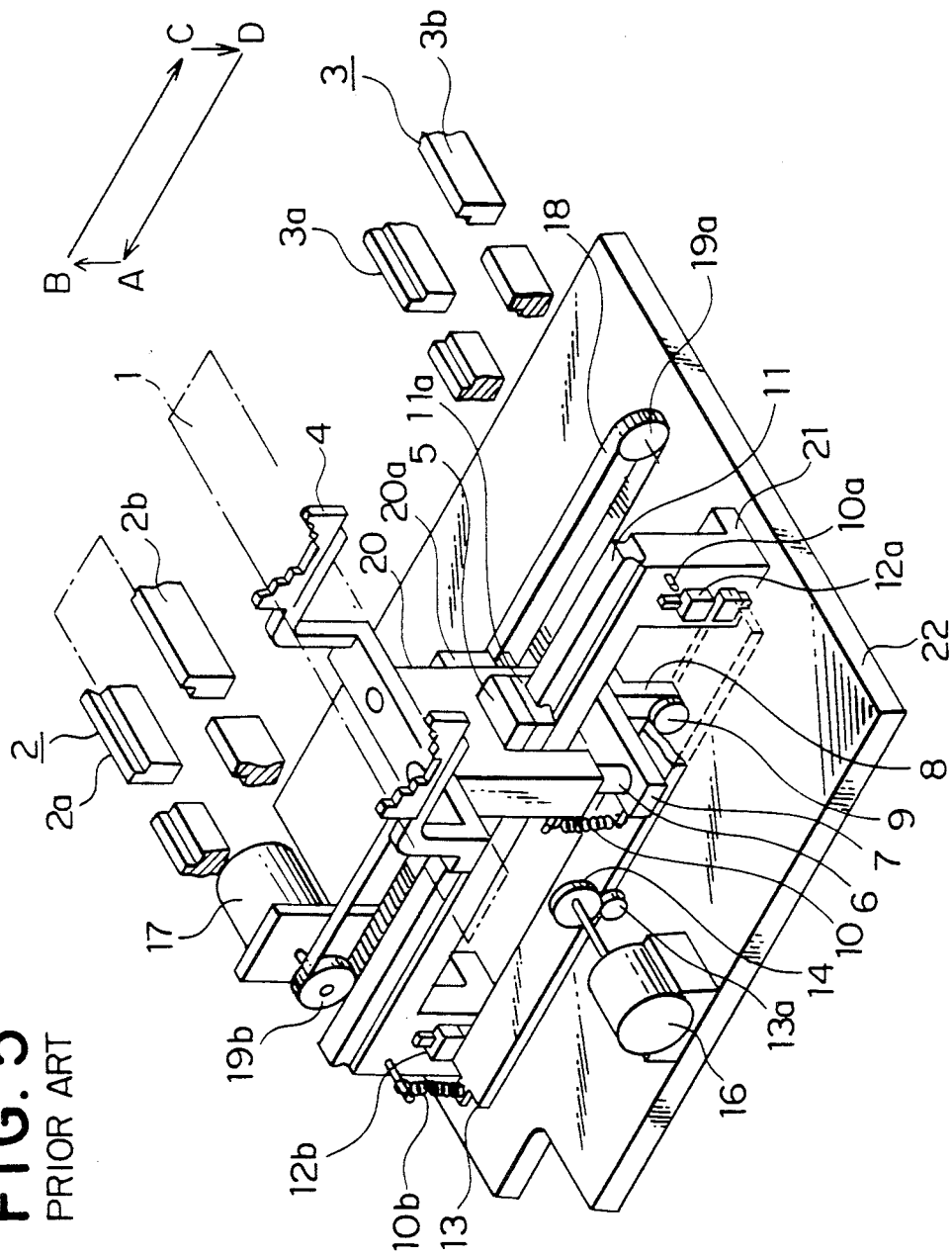
FIG. 5 is a schematic perspective view of a conventional lead frame conveying apparatus.
Figure 6:
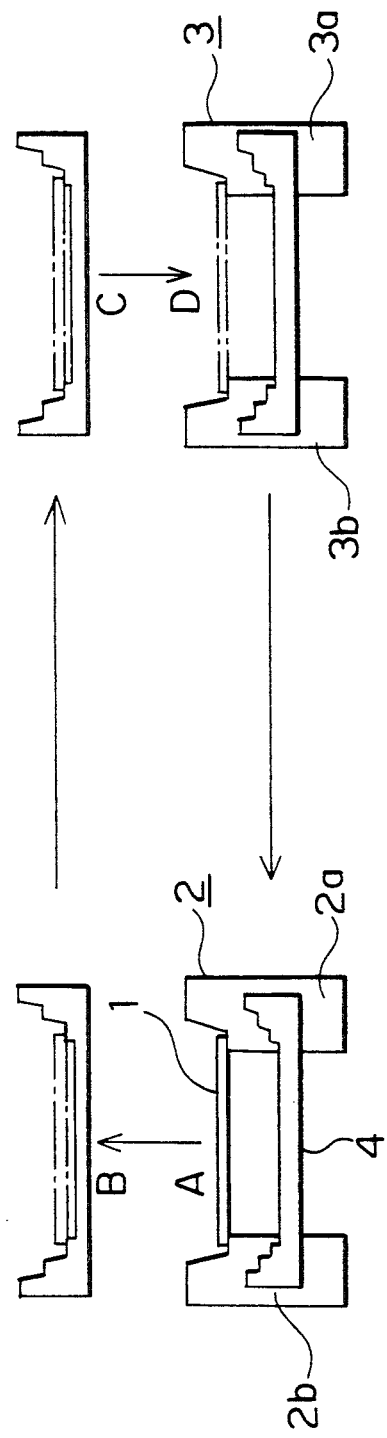
FIG. 6 is a drawing for explaining the operation of the lead frame conveying apparatus shown in FIG. 5.

An embodiment of the present invention is described below with reference to the drawings. FIG. 1 is a schematic perspective view of a lead frame conveying apparatus in accordance with an embodiment of the present invention, FIG. 2 is a partially sectional top view, FIG. 3 is a front view without showing a timing pulley portion, and FIG. 4 is a partially sectional side view of a principal portion. In each of the drawings, the portions which are the same as or correspond to those of the conventional apparatus shown in FIGS. 5 and 6 are denoted by the same reference numerals. The arrangement of a lead frame conveying apparatus according to the present invention is outlined below. The elliptic motion of timing pulleys 19a, 19b and a timing belt 18 placed over the pulleys 19a, 19b, which serve as driving force transmitting means, is converted into a rectangular motion, which comprises vertical motions and horizontal motions so as to described a rectangle, by a moving block 100 serving as moving block means and the driving force converting means described below which is loaded on the moving block 100. The rectangular motion is then transmitted to a frame receiving arm 4 serving as frame receiving means.

In the perspective view of FIG. 1, a base plate 22 is a base on which the lead frame conveying apparatus is installed. A horizontal linear guide rail 11 fixed on the base plate 22 so as to serve as horizontal linear guide means horizontally guides the moving block 100. An induction motor 17 serving as driving means rotates the timing pulley 19b through gears 15a, 15b so that the timing belt 18 placed over the timing pulleys 19a, 19b performs an elliptic motion. The elliptic motion of the timing belt 18 comprises the horizontal reciprocating rectilinear motion within the distance between the centers of the timing pulleys 19a, 19b and the semi-circular motions at both ends of the reciprocating rectilinear motion, i.e., outside the distance between the centers of the timing pulleys 19a, 19b. Stoppers 25a, 25b serving as stopper means horizontally position the frame receiving arm 4 according to the positions of the guide rails 2, 3 and abut, at predetermined positions at both ends of the horizontal motion, against the slide block 23 of the moving block 100 to which the lower end member 4a of the arm 4 is attached so as to stop the slide block 23. The slide block 23 is slidably provided on two parallel shafts 30 supported by the bearing block 24. A first eccentric shaft 26a provided on the side of a first disc 26 opposite to the moving block 100 is fixed at a predetermined position of the timing belt 18, the first disc 26 being rotatably provided on the moving block 100. The horizontal motion of the elliptic motion of the timing belt 18 between the centers of the timing pulleys 19a, 19b is transmitted through the first disc 26 to the whole moving block 100 to which the frame receiving arm 4 is attached so that the moving block 100 is moved on the linear guide rail 11. The semi-circulation motion at each of the timing pulleys 19a, 19b is converted into a vertical motion and then transmitted to the frame receiving arm 4 through the first disc 26, the rotation shaft 35 of the first disc 26 which is extended through the moving block 100 (refer to FIG. 4), a second disc 28 provided at the opposite end of the rotational shaft 35, the second eccentric shaft 28a of the second disc 28 and the rolling bearing 9 fitted to the second eccentric shaft 28a.

In FIGS. 2 to 4, FIGS. 2 and 4 are partially sectional views showing the peripheral portion of the timing pulley 19a and the portion including the rotational shafts and bearings, respectively. FIG. 3 does not show the portion corresponding to the timing pulleys. As shown in FIGS. 3 and 4, the slide block 23 is slidably provided on the two shafts 30 through rolling bearings 31. The two shafts 30 are supported at both ends thereof by the bearing block 24. As shown in FIGS. 2 and 4, extension spring coils 27a, 27b are respectively interposed between the side block 23 and the both sides of the bearing block 24. If no external force is applied to the slide block 23, the slide block 23 is placed at the neutral position (generally at the center of the block 24) between the forces of the coil springs 27a, 27b. For example, when the slide block 23 abuts the stopper 25a or 25b at one end of the horizontal motion thereof and is subjected to a force, the slide block 23 is slid along the shafts 30 against the force of the coil spring 27a or 27b and returned to the neutral position as external force is decreased. The vertical linear guide rail 12 vertically extended and provided on the lower end member 4a of the frame receiving arm 4 is slidably fitted to the vertical linear guide bearing 12a provided on the slide block 23 through a holder 5a. Supporting portions 19c and 19d support the timing pulleys 19a and 19b, respectively. Supporting portions 25c and 25d support the stoppers 25a and 25b, respectively.

As shown in FIG. 4, the moving block 100 serving as moving block means basically comprises the bearings block 24 which supports the slide block 23 and which is fixed through the holder 5 on the linear guide bearing 11a slidably fitted to the linear guide rail 11. The driving force converting means comprising the rotational shaft, 35, the bearing 29 thereof and so on and the frame receiving means comprising the frame receiving arm 4 and so on are mounted on the moving block 100. The frame receiving arm 4 has a bottom portion (lower surface) 4b which is formed in the lower portion thereof and which has a horizontal surface in rolling contact with the rolling bearing 9 provided on the second eccentric shaft 28a of the second disc 28. The rolling contact between the bottom portion 4b and the rolling bearing 9 absorbs the horizontal component of the semicircular motion at each of the timing pulleys 19a, 19b so that the vertical component only is transmitted to the frame receiving arm 4. The semi-circular motion at each of the timing pulleys 19a, 19b is thus converted into the vertical motion and transmitted to the arm 4. Assuming that the distance between the centers of the rotational shaft 35 and the second eccentric shaft 28a is R, the width of the bottom portion 4b in the direction of rolling of the rolling bearing 9 must be thus at least 2R. The driving force converting means comprises that first disc 26, the first eccentric shaft 26a, the rotational shaft 35, the bearing 29, the second disc 28, the second eccentric shaft 28a and the rolling bearing 9. A connecting pin 20 connects the timing belt 18 and the first eccentric shaft 26a. The mounting portion 26b of the first eccentric shaft 26a has a plane portion 26c formed for mounting the connecting pin 20. The connecting pin 20 is passed through the timing belt 18 and buried at the tip thereof in the mounting portion 26b so as to be fixed to the first eccentric shaft 26a, with the timing belt 18 held between the pin 20 and the mounting portion 26b. Each of the timing pulleys 19a, 19b has a clearance groove 19e for the connecting pin 20 formed along the central portion of the periphery thereof.

The operation of the apparatus is described below. The frame receiving arm 4 is waits for the lead frame 1 at point A. In this state, the slide block 23 abuts against the stopper 25a, and the frame receiving arm 4 is placed at a lower position. When the motor 17 is driven, the timing belt 18 is rotated through the gears 15a, 15b and the timing pulley 19b to make an elliptic motion. Since the first eccentric shaft 26a attached to the timing belt 18 by the connecting pin 20 is thus upwardly moved along the outer periphery of the timing pulley 19a so as to described a semi-circle, the first disc 26 is rotated. The rotation of the first disc 26 causes the second eccentric shaft 28a to be rotated around the center of the rotatioal shaft 35 along a circle with a radius of R. Since the rolling bearing 9 is in rolling contact with the lower surface 4b of the frame receiving arm 4, the rotation with a radius of R is converted into an upward movement and transmitted to the frame receiving arm 4. The frame receiving arm 4 is thus upwardly moved to point B while being guided by the linear guide rail 12 fixed to the slide block 23 so as to scoop up the lead frame 1 conveyed from an external apparatus (not shown) to the guide rail 2 comprising two rails 2a, 2b. When the motor 17 is further continuously driven, the timing belt 18 continues an elliptic motion, and the first eccentric shaft 26a makes a horizontal motion along the upper portion of the timing belt 18. At this time, the slide block 23 to which the frame receiving arm 4 is attached is at the neutral position in the bearing block 24 by virtue of the two extension coil springs 27a, 27b interposed between the slide block 23 and the bearing block 24. The moving block 100 comprising the bearing 29, the arm 4 and the like is moved from point B to point C by the horizontal movement of the first eccentric shaft 26a while being guided the linear guide rail 11. When the moving block 100 reaches point C, the slide block 23 abuts against the stopper 25b so that the frame receiving arm 4 is positioned between the rails 3a, 3b of the guide rail 3. When the timing belt 18 is further rotated, the portion of the moving block 100 except the slide block 23 and the frame receiving arm 4 continues a horizontal movement. After the first eccentric shaft 26a is passed through an upper contact point on the outer periphery of the timing pulley 19b, the first eccentric shaft 26a performs a downward semicircular motion along the outer periphery of the timing pulley 19b. The semi-circular motion of the first eccentric shaft 26a is converted into a downward rectilinear motion through the rotational shaft 35, the second disc 28, the second eccentric shaft 28a and the rolling bearing 9 and transmitted to the frame receiving arm 4. The arm 4 thus lowers the lead frame 1 to the guide rail 3 and reaches point D. When the timing belt 18 is further rotated, the first eccentric shaft 26a performs a horizontal motion after being passed through a lower contact point on the outer periphery of the timing pulley 19b so that the moving block 100 including the frame receiving arm 4 starts to horizontally move. At this time, if the slide block 23 is separated from the stopper 25b, the slide block 23 is moved to a position (generally at the center of the bearing block 24) where the spring forces of the two coil springs 27a, 27b are balanced. The moving block 100 then continues the horizontal movement. When the slide block 23 abuts against the stopper 25a and reaches point A, a sequence of operations are completed in one cycle. Thus the lead frame 1 is completely transferred from the guide rail 2 to the guide rail 3.

When the lead frame 1 is transferred from the guide rail 3 to the guide rail 2, the motor 17 is reversed so that the timing belt 18 makes an elliptic motion in the reverse direction.

As described above, in the present invention, the timing belt placed over the two timing pulleys makes an elliptic motion in which the horizontal reciprocating rectilinear motion between the centers of the timing pulleys, or between the stoppers provided at both ends of the conveyance direction, is transmitted to the frame receiving arm as it was, and the remaining rectilinear motion and subsequent semi-circular motion along each of the pulleys at both ends of the reciprocating rectilinear motion outside of the distance between the centers of the timing pulleys, or outside the stoppers at both ends of the conveyance direction, is converted into a vertical reciprocating rectilinear motion by employing rolling contact and slidably attaching the frame receiving arm to the moving block with horizontal elasticity so as to absorb the horizontal component thereof and then transmitted to the frame receiving arm. The invention thus requires only one induction motor as driving means and has the effect of obtaining a method of converting an elliptic motion to a rectangular motion at very low cost, a horizontal conveying mechanism which employs the method, and a lead frame conveying apparatus which employs the conveying mechanism.

What is claimed is:

1. A lead frame conveying apparatus for transferring a lead frame sent to one of two guide rails between said two guide rails by scooping up said lead frame in a space formed by partially cutting off each of said guide rails, said apparatus comprising:

frame receiving means for carrying said lead frame placed thereon;

moving block means holding said frame receiving means so that said frame receiving means vertically slides so as to be elastically balanced at a predetermined neutral position thereof in the horizontal direction along the direction of transfer;

horizontal linear guide means extended between said guide rails so as to horizontally guide said moving block means along said direction of transfer of said lead frame;

stopper means for horizontally positioning said frame receiving means according to the positions of said two guide rails;

driving force transmitting means which performs an elliptic motion describing an ellipse and comprising horizontal reciprocating rectilinear motion between said two guide rails and semi-circular motions at both ends of said reciprocating rectilinear motion;

driving means for giving a driving force to said driving force transmitting means; and driving force converting means provided on said moving block means and connected to said driving force transmitting means and said frame receiving means so as to transmit said horizontal reciprocating rectilinear motion of said elliptic motion of said driving force transmitting means to said frame receiving means and convert said semi-circular motions at both ends of said reciprocating rectilinear motion into vertical reciprocating rectilinear motions by employing rolling contact for absorbing the horizontal component thereof and transmit said vertical reciprocating rectilinear motions to said frame receiving means so as to put said frame receiving means into rectangular motion.

2. A lead frame conveying apparatus according to claim 1, wherein:

said frame receiving means comprises at least one frame receiving arm for scooping up said lead frame and carrying it placed thereon, a lower end member provided integrally with said frame receiving arm and vertically extended for supporting said frame receiving arm, and a lower surface provided at the lower end of said lower end member and horizontally extended along said direction of transfer;

said horizontal linear guide means comprises a linear guide rail extended between said two guide rails, and a linear guide bearing moved on said linear guide rail;

said moving block means comprises a slide block for supporting said lower end member of said frame receiving means so that said frame receiving means can be vertically slid, at least one shaft for elastically slidably supporting said slide block so that said slide block is balanced at the predetermined neutral position in the horizontal direction along said direction of transfer of said frame, and a moving block provided with elastic materials and a bearing block for supporting said shaft and said elastic materials and fixed to said linear guide bearing so as to be moved on said linear guide rail along it;

said stopper means comprises stoppers provided at both ends of said linear guide rail and abutting against said slide block on said moving block so as to position said frame receiving means with respect to said two guide rails;

said driving force transmitting means comprises a timing belt which performs an elliptic motion describing an ellipse and which is extended between said two guide rails along said linear guide rail on the side opposite to said lower end member of said frame receiving means, and two timing pulleys provided at both ends of said timing belt;

said driving means comprises a motor for rotating one of said two timing pulleys; and said driving force converting means comprises a rotational shaft passed through said moving block in the direction vertical to said linear guide rail and rotatably supported, a first eccentric shaft having one end eccentrically fixed to said rotational shaft on the side of said timing belt and other end fixed to said timing belt, and a second eccentric shaft having one end eccentrically fixed to said rotational shaft on the side of said lower end member and other end being in rolling contact with the lower surface of said lower end member.

3. A lead frame conveying apparatus according to claim 2, wherein said other end of said first eccentric shaft is fixed to said timing belt by a connecting pin passed through said timing belt, and said other end of said second eccentric shaft has a rolling bearing which absorbs the horizontal movement by employing rolling contact with said lower surface of said lower end member of said frame receiving means.

4. A lead frame conveying apparatus according to claim 2, wherein said lower end member of said frame receiving means is provided with a vertical linear guide rail vertically extended, said slide block is provided with a vertical linear guide bearing which is moved along said vertical linear guide rail, and said lower end member is fitted to said slide block so as to be vertically slidable.

5. A lead frame conveying apparatus according to claim 2, wherein said moving block of said moving block means has two shafts which are supported by said bearing block and which are extended parallel along said direction of transfer of said frame, said slide block having two slide bearings through which said two shafts are passed so that said slide block is slidably supported by said bearing block, and said two elastic materials connected between said slide block and said bearing block and pulling said slide block from both sides thereof so as to elastically support said slide block to be balanced at the predetermined neutral position.

6. A horizontal conveying mechanism performing a rectangular motion for converting an elliptic motion of a timing belt placed over two timing pulleys into a rectangular motion and transmitting said rectangular motion to a portion to be driven, said elliptic motion describing an ellipse and comprising a horizontal reciprocating linear motion along a length not less than that of the horizontal conveying distance, and semi-circular motions at both ends of said reciprocating linear motion, said mechanism comprising:

moving block means holding said portion to be driven so that said portion to be driven horizontally slides so as to be elastically balanced at a predetermined neutral position thereof in the horizontal direction;

horizontal linear guide means horizontally guiding said moving block means and having a length which is not less than that of the horizontal conveying distance;

stopper means for horizontally positioning said portion to be driven according to the positions at both ends of said horizontal conveying distance; and driving force converting means provided on said moving block means and connected to said timing belt and said portion to be driven so as to transmit said horizontal reciprocating linear motion of said elliptic motion of said timing belt to said portion to be driven, and convert said semi-circular motions at both ends of said reciprocating linear motion into a vertical reciprocating linear motion by employing rolling contact for absorbing the horizontal component and transmit said vertical reciprocating linear motion to said portion to be driven.

* * * * *